United States Patent
Seiwart et al.

(10) Patent No.: US 8,727,323 B2
(45) Date of Patent: *May 20, 2014

(54) DEVICES, SYSTEMS, AND METHODS FOR CARBONATION OF DEIONIZED WATER

(71) Applicant: MKS Instruments, Inc., Andover, MA (US)

(72) Inventors: Johannes Seiwart, Berlin (DE); Ulrich Brammer, Berlin (DE); Christiane Gottschalk, Berlin (DE); Joachim Lohr, Berlin (DE)

(73) Assignee: MKS Instruments, Inc., Andover, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/871,626

(22) Filed: Apr. 26, 2013

(65) Prior Publication Data

US 2013/0313728 A1 Nov. 28, 2013

Related U.S. Application Data

(60) Division of application No. 12/792,470, filed on Jun. 2, 2010, now Pat. No. 8,448,925, which is a continuation-in-part of application No. 11/873,776, filed on Oct. 17, 2007, now Pat. No. 7,731,161.

(60) Provisional application No. 60/852,265, filed on Oct. 17, 2006.

(51) Int. Cl.
*B01F 3/04* (2006.01)

(52) U.S. Cl.
USPC .......... 261/26; 261/64.1; 261/66; 261/DIG. 7

(58) Field of Classification Search
USPC .............. 261/26, 64.1, 66, 94, 121.1, DIG. 7; 210/746
See application file for complete search history.

(56) References Cited

U.S. PATENT DOCUMENTS

| | | | |
|---|---|---|---|
| 4,173,178 | A | 11/1979 | Wieland |
| 4,517,135 | A | 5/1985 | Szerenyi et al. |
| 4,673,443 | A | 6/1987 | Fetty |
| 5,175,124 | A | 12/1992 | Winebarger |
| 5,264,025 | A | 11/1993 | Asai et al. |
| 5,336,371 | A | 8/1994 | Chung et al. |
| 6,138,995 | A | 10/2000 | Page |

(Continued)

FOREIGN PATENT DOCUMENTS

| | | |
|---|---|---|
| GB | 2343637 | 5/2000 |
| JP | 59173184 | 10/1984 |

(Continued)

OTHER PUBLICATIONS

Notification of Transmittal of the International Search Report and the Written Opinion of the International Searching Authority, or the Declaration for International Application No. PCT/US2011/038076, date of mailing Aug. 29, 2011 (9 pages).

*Primary Examiner* — Richard L Chiesa

(74) *Attorney, Agent, or Firm* — Proskauer Rose LLP

(57) ABSTRACT

Devices, systems, and methods employed in wet cleaning semiconductor devices are provided. In particular, systems that can deliver deionized water with the desired concentration of CO2 and methods of generating deionized water with a desired concentration of CO2 for use in wet cleaning of semiconductor devices are provided.

17 Claims, 12 Drawing Sheets

(56) References Cited

U.S. PATENT DOCUMENTS

| | | | |
|---|---|---|---|
| 6,158,721 | A | 12/2000 | Katou et al. |
| 6,631,334 | B2 | 10/2003 | Grosshart |
| 6,890,864 | B2 | 5/2005 | Aoki et al. |
| 7,022,610 | B2 | 4/2006 | Chou et al. |
| 7,246,793 | B2 | 7/2007 | Nagasaka et al. |
| 7,533,873 | B2 | 5/2009 | Nagasaka et al. |
| 7,731,161 | B2 | 6/2010 | Seiwert et al. |
| 8,448,925 | B2 * | 5/2013 | Seiwert et al. .............. 261/26 |
| 2003/0006513 | A1 | 1/2003 | Gotoh et al. |
| 2003/0168754 | A1 | 9/2003 | Spiegel et al. |
| 2005/0133066 | A1 | 6/2005 | Takahashi |
| 2006/0279007 | A1 | 12/2006 | Sakakibara et al. |
| 2008/0257738 | A1 | 10/2008 | Seiwert et al. |
| 2011/0134716 | A1 * | 6/2011 | Seiwert et al. .............. 366/101 |

FOREIGN PATENT DOCUMENTS

| | | |
|---|---|---|
| JP | 60000876 | 1/1985 |
| JP | 63274488 | 11/1988 |
| JP | 2279158 | 11/1990 |
| JP | HEI-07-67554 | 7/1995 |
| JP | 10202242 | 8/1998 |
| JP | 10223592 | 8/1998 |
| JP | 2000354729 | 12/2000 |
| JP | 200425078 | 1/2004 |
| JP | 2004344821 | 12/2004 |
| JP | 2006012966 | 1/2006 |
| KR | 20020093397 | 12/2002 |

* cited by examiner

DEVICES, SYSTEMS, AND METHODS FOR CARBONATION OF DEIONIZED WATER

CROSS-REFERENCE TO RELATED APPLICATIONS

This application is a divisional of U.S. patent application Ser. No. 12/792,470, filed Jun. 2, 2010, now U.S. Pat. No. 8,448,925, which is a continuation-in-part of U.S. application Ser. No. 11/873,776, filed Oct. 17, 2007, now U.S. Pat. No. 7,731,161 which claims the benefit of and priority to U.S. Provisional Patent Application Ser. No. 60/852,265 filed on Oct. 17, 2006, the entire teachings of which are incorporated herein by reference.

FIELD OF THE INVENTION

In general, the invention relates to devices, systems, and methods employed in wet cleaning semiconductor devices. In particular, the invention relates to systems that can deliver deionized water with the desired concentration of CO2 and methods of generating deionized water with a desired concentration of CO2 for use in wet cleaning of semiconductor devices.

BACKGROUND OF THE INVENTION

Microelectronics chips such as integrated circuits are made from comparatively large wafers of semiconductor material. This process typically involves multiple successive steps including the following: generation of an etch mask photolithographically; etching of a layer of material as defined by the mask; removal of the photolithographic mask through some combination of wet and dry chemical techniques; and deposition of layers of materials. The photolithographic mask is formed from a polymeric material called a photoresist. After the photoresist mask has been removed, a final cleaning step, called rinsing or wet cleaning, is typically performed.

Deionized (DI) water is known for its use in this rinsing of semiconductor devices. It is known to prevent any metal corrosion and contamination of the devices. In order to make the wet cleaning more effective, gases such as carbon dioxide (CO2) and nitrogen (N2) have often been mixed with the DI water. Rinsing with carbonated deionized (DI-CO2) water is an electrically inert process that allows for damage free cleaning while maintaining the device integrity.

Carbonated deionized (DI-CO2) water can be created by inserting carbon dioxide (CO2) and water (H2O) or deionized (DI) water into a contactor. The contactor allows for the carbon dioxide (CO2) and the water (H2O) to directly contact one another without dispersing one phase into the other. There exists various types of contactors. For example, membrane contactors allow for a "bubble free" carbonated deionized (DI-CO2) water but cause a low CO2 mass transfer efficiency due to diffusion rates of CO2 through the membrane located therein. In addition, the membrane of the membrane contactor has a limited lifetime and requires regular maintenance. Another example of a contactor is a packed column type contactor. Packed columns typically have a high mass transfer efficiency, however the packed column presents several disadvantages. For example, the high mass transfer efficiency requires that the packed column is filled mostly with CO2 while H2O rinses over a high surface area of the packed column's tower packing. Flowing CO2 gas through a continuous H2O phase is inefficient because the bulk of the H2O provides a high diffusion resistance compared to the thin water film rinsing down the tower packing. Thus the diffusion rate of the CO2 into the H2O is limited. Further, a continuous H2O phase can require extraneous and expensive measurement devices to control a level of H2O in the packed column because if the H2O level becomes too high, the CO2 gas flows mostly through the H2O resulting in a less efficient operation. Also, a continuous H2O phase can require controlling the level of H2O to avoid CO2 in the H2O outlet and H2O in the CO2 outlet. Further disadvantages of the packed column are as follows: 1) CO2 is lost at the outlet of an inert gas that is typically used in the packed column, 2) the injection of the inert gas can lower the CO2 concentration, thus lowering the overall mass transfer efficiency.

Controlling the proportions of these gases require considerably complex instrumentation and high costs which are significant disadvantages of current methods. Typically, an excess of gas is used which can lead to toxicity and disposal problems with respect to the unused gases particularly carbon dioxide. As a result, these processes are expensive and cumbersome.

SUMMARY OF THE INVENTION

In one aspect, the invention features a system for carbonation of deionized water. The system includes a deionized water source, a carbon dioxide gas source and a contactor in fluid communication with the deionized water source and the carbon dioxide gas source via at least one inlet of the contactor, to generate carbonated deionized water. The system also includes at least one sensor in fluid communication with the at least one inlet or at least one outlet of the contactor for measuring flow rate of the deionized water and temperature of the deionized water. The system also includes a controller in communication with the at least one sensor and the carbon dioxide gas source for determining an amount of carbon dioxide gas the carbon dioxide gas source supplies to the contactor such that a specific conductivity of the carbonated deionized water is generated in the contactor, wherein the determination is based on the measured flow rate and temperature.

In some embodiments, the system includes one or more flow restrictors and one or more valves that are in fluid communication with the carbon dioxide gas source and the contactor for controlling the amount and flow rate of carbon dioxide gas entering the contactor. In some embodiments, the controller varies the at least one valve between an open and a closed position such that an average amount of carbon dioxide gas that flows from the carbon dioxide gas source to the contactor is substantially equal to the determined amount of carbon dioxide gas supplied by the carbon dioxide gas source.

In some embodiments, the system includes at least four flow restrictors. In some embodiments the system includes an outlet of the contactor for purging an amount of carbon dioxide gas. In some embodiments, the controller determines the amount of carbon dioxide gas to purge such that a specific conductivity of the carbonated deionized water is generated in the contactor.

In some embodiments, the system includes at least one flow restrictor in fluid communication with the outlet of the contactor and a drain for controlling the amount and flow rate of carbon dioxide gas purged from the contactor. In some embodiments, the system includes at least one flow orifice in fluid communication with the outlet of the contactor and a drain for controlling the amount and flow rate of carbon dioxide gas purged from the contactor.

In some embodiments, the controller sets a pressure of carbon dioxide gas at the at least one inlet. In some embodiments, the deionized water provided by the deionized water source and carbon dioxide provided by the carbon dioxide source are mixed prior to entering the contactor.

In some embodiments, the system includes a first sensor in fluid communication with at least one inlet of the contactor for measuring flow rate of the deionized water and a second sensor in fluid communication with at least one outlet of the contactor for measuring temperature of the deionized water.

In some embodiments, the system includes a first sensor in fluid communication with at least one inlet of the contactor for measuring temperature of the deionized water and a second sensor in fluid communication with at least one outlet of the contactor for measuring flow rate of the deionized water.

In another aspect, the invention involves a method for carbonation of deionized water. The method involves supplying deionized water to a contactor, supplying carbon dioxide gas to the contactor and measuring, with at least one sensor, flow rate of the deionized water and temperature of the deionized water, wherein the at least one sensor is positioned at an inlet of the contactor or an outlet of the contactor. The method also involves, determining an amount of carbon dioxide gas to supply to the contactor such that a specific conductivity of carbonized deionized water is generated by the contactor in communication with the at least one sensor and the supply of carbon dioxide gas, wherein the determination is based on the measured flow rate and temperature. The method also involves, supplying the determined amount of carbon dioxide to the contactor via one or more flow restrictors and one or more valves that are in fluid communication with the supply of carbon dioxide gas and the contactor and flowing the carbonated deionized water of a specific conductivity from the contactor.

In some embodiments, the method involves varying the at least one valve between an open and a closed position such that an average amount of carbon dioxide gas that flows from the carbon dioxide gas source to the contactor is substantially equal to the determined amount of carbon dioxide gas supplied by the carbon dioxide gas source. In some embodiments, the method involves purging an amount of the carbon dioxide gas through an outlet of the contactor. In some embodiments, the method involves determining the amount of carbon dioxide gas to purge such that a specific conductivity of the carbonated deionized water is generated in the contactor.

In some embodiments, the method involves at least one flow restrictor in fluid communication with the outlet of the contactor and a drain for controlling the amount and flow rate of carbon dioxide gas purged from the contactor. In some embodiments, the method involves at least one flow orifice in fluid communication with the outlet of the contactor and a drain for controlling the amount and flow rate of carbon dioxide gas purged from the contactor. In some embodiments, the method involves setting a pressure of carbon dioxide gas at the at least one inlet. In some embodiments, the method involves mixing deionized water provided by the deionized water source and carbon dioxide provided by the carbon dioxide source prior to entering the contactor.

In some embodiments, the method involves measuring flow rate, with a first sensor, of the deionized water at an inlet of the contactor and measuring temperature, with a second sensor, of the deionized water at an outlet of the contactor.

In some embodiments, the method involves measuring temperature, with a first sensor, of the deionized water at an inlet of the contactor and measuring flow rate, with a second sensor, of the deionized water at an outlet of the contactor.

The systems and methods of the present invention provide a number of advantages. One advantage of the present invention is that the conductivity as provided by the systems and methods can change very quickly in response to a change in the conductivity set point. In addition, the system of the present invention does not require an inert gas, thus the outlet typically is used to purge excessive $CO_2$ in case of a lowering of the conductivity set point or to purge inert gas that have enriched from the $H_2O$ in the $CO_2$-gas in the contactor.

Another advantage of embodiments of the present invention is that flow restrictors control the $CO_2$ flow and the DI water flow. This is advantageous for several reasons. First, flow restrictors are smaller in size than Mass Flow Controllers (MFC's) allowing the system to be more compact. Second, flow restrictors are typically less expensive than MFC's. Third, flow restrictors are available in materials that are compatible with carbonated deionized water. Thus, providing the advantage that the flow restrictor is not damaged by unintended contact with $CO_2$, as is the case with an MFC. Fourth, safety measure taken to avoid back flow into the MFC's are not necessary with flow restrictors because back flow is not likely with flow restrictors. As a result, these safety measures can be eliminated or reduced, thereby decreasing costs and/or increasing efficiency.

BRIEF DESCRIPTION OF DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the invention.

DETAILED DESCRIPTION OF THE INVENTION

The present invention provides devices, systems, and methods of making DI-$CO_2$ water for wet cleaning of semiconductor devices. In general, the devices, systems, and methods provide wet cleaning of semiconductor devices while preventing or reducing damage created by electrostatic charge. In one aspect, the invention provides a device with a high level of control and consistency over a desired concentration of carbon dioxide in the DI-$CO_2$ water. In another aspect, the devices, systems and methods can be used to generate DI-$CO_2$ water containing a large range of different $CO_2$ concentrations. For example, the devices, systems and methods can generate low CO2 concentration DI-CO2 water (0.154 mg/L CO2) as well as high CO2 concentration DI-CO2 water (1540 mg/L). In general, the devices, systems, and methods of the present invention eliminate a need for adding excess CO2 gas, nitrogen gas, or any other gas to a contactor for the DI-CO2 generation, thereby reducing the cost, size and complexity of the devices, systems, and methods. Most, if not all, of the carbon dioxide gas utilized in the devices, systems, and methods gets dissolved in the DI water. As a result, disposal and toxicity issues are reduced over conventional systems which typically use excess CO2 gas.

In certain embodiments, the invention provides devices, systems and methods of making DI-CO2 water in which conductivity of the DI-CO2 water can be efficiently controlled and altered quickly during manufacture. In another aspect, the devices, systems and methods of the present invention use flow restrictors which do not need to be monitored for flow back of water, thus eliminating the need for additional safety monitors. Flow restrictors and valves are also compatible with DI-CO2, minimizing the risk of corrosion in the system. As a result, the overall cost, size and required maintenance of the system is reduced.

Figure 1:
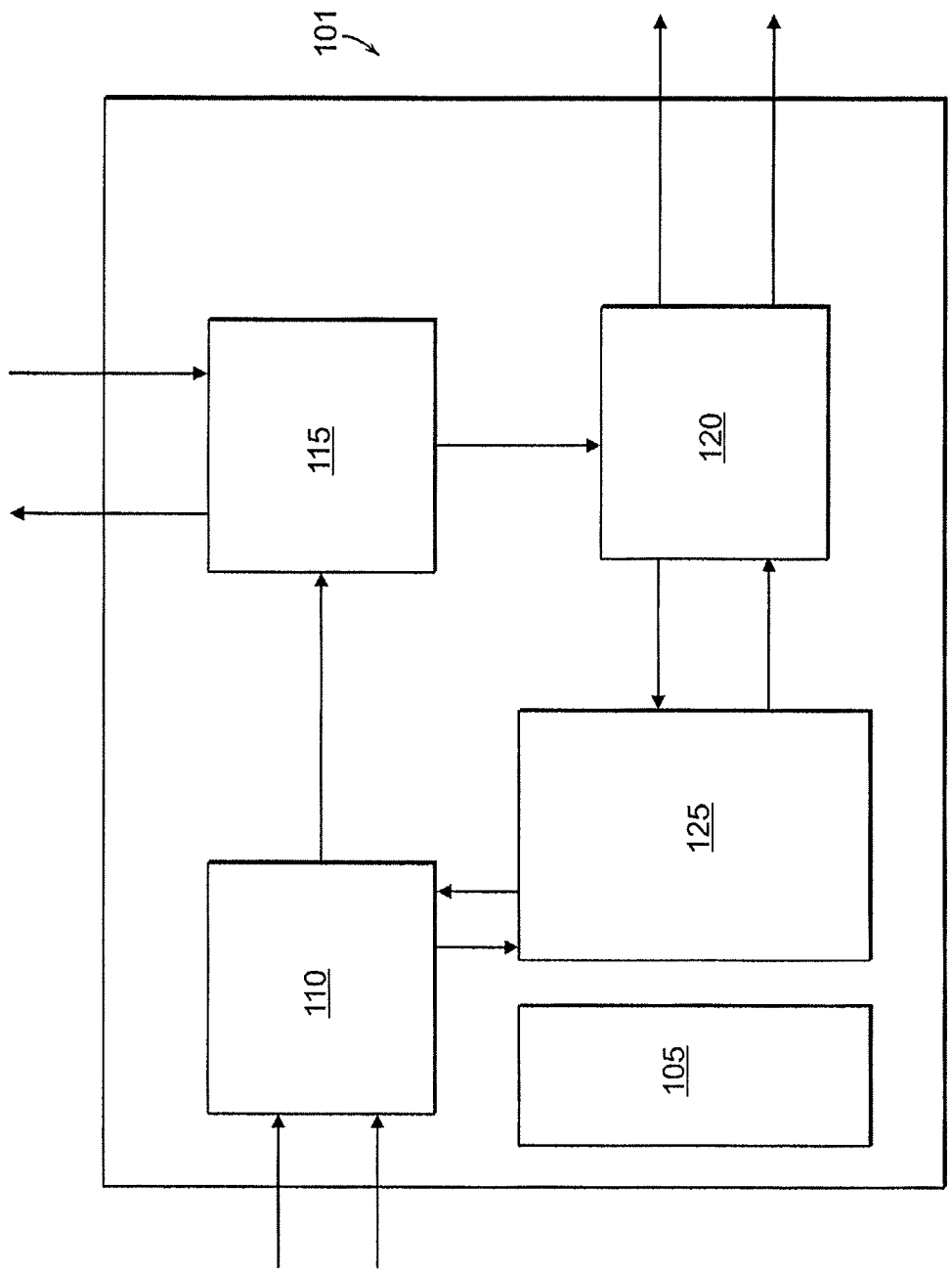
FIG. 1 is a block diagram of a first embodiment of the system for generating DI-$CO_2$ water.

FIG. 1 shows an embodiment of a system used to carbonate ultra-pure DI water (i.e., add CO2 to the DI water). System 101 typically includes a source of electrical power supply 105, a gas module 110, a contactor 115, and a sensor module 120. System 101 can also include a control module 125.

The gas module 110 can be connected to one or more sources of gases such as CO2 and Nitrogen. Gas module 110 can include a plurality of variable valves, on/off valves, filters and mass flow controllers to monitor and/or control the flow rate and amount of each gas entering and exiting the gas module 110. The gases can exit the gas module 110 separately or can be pre-mixed before exiting. Upon exiting the gas module 110, the gases can be delivered to contactor 115.

Contactor 115 typically includes at least one inlet for the gases, at least one inlet for DI water, at least one outlet to release excess gas and at least one outlet to release DI-CO2 water. The gases can be injected, or purged into the contactor 115. The contactor 115 can be pressurized or evacuated if desired. The contactor 115 typically allows for generation of bubble free DI-CO2 water.

The DI-CO2 water can be released from contactor 115 and passed through sensor module 120. Sensor module 120 can include a plurality of sensors to monitor and/or control a plurality of parameters of the DI-CO2 water. Such parameters can include flow-rate, conductivity, temperature and pressure of the DI-CO2 water. The DI-CO2 water can be drained out of the sensor module 120 to be used as required or can be redirected back into the system if necessary.

System 101 can include a control module 125 in fluid communication with sensor module 120 and gas module 110. Control module 125 can include a processor, a keypad and a display. The processor can be for example, a microprocessor of a computer. Control module 125 can allow automatic control and/or monitoring of each valve, mass flow controller and sensor in system 101. Each valve, mass flow controller and sensor in system 101 can also be controlled manually.

In one embodiment, the control module 125 can determine an amount of CO2 to provide to the contactor 115 based upon a conductivity (L) set-point controlled by a user. For example, when CO2 is dissolved in H2O, it forms carbonic acid (H2CO3) according to the following reaction:

$$CO2(aq) + H2O \leftrightarrow H2CO3 \qquad \text{EQN. 1}$$

where CO2(aq) refers to dissolved CO2. At room temperature, approximately 0.3% of the CO2(aq) converts to H2CO3. A species (H2CO3*) can be defined as follows:

$$[H2CO3^*] = [CO2(aq)] + [H2CO3] \qquad \text{EQN. 2}$$

The concentration of CO2(aq) is proportional to the concentration of H2CO3*. In some embodiments, the CO2(aq) is proportional to the H2CO3* within an accuracy limit of 1%.

To obtain the CO2(aq) as a function of the conductivity (L), the equation for the dissociation constant (K1) of the H2CO3 and conductivity (L) of the CO2(aq) can be used. Using the relationship in EQN. 2, a dissociation constant (K1) of H2CO3 can be defined as follows:

$$K1 = [H+][HCO3-]/[CO2(aq)] \qquad \text{EQN. 3}$$

where H+ is a Hydrogen ion and HCO3− is a Bicarbonate ion.

The conductivity (L) of the CO2(aq) is proportional to the concentration of [H+] and [HCO3−] according to the following:

$$L = A^*[H+] + B^*[HCO3-] \qquad \text{EQN. 4}$$

where A is the specific molare conductivity for the hydrogen ion [H+} and B is the specific molare conductivity of the bicarbonate ion.

Typically, the CO2 is dissolved in deionized water (DI). In these embodiments, the concentrations of H+ and HCO3− are equal. In these embodiments, EQN. 3 and EQN. 5 are reduced to the following:

$$[CO2(aq)] = [HCO3-]^2/K1 \qquad \text{EQN. 5}$$

$$L = (A+B)^*[HCO3-] \qquad \text{EQN. 6}$$

Substituting EQN. 6 into the reaction described above in EQN. 1, results in obtaining the dissolved CO2(aq) as a function of conductivity (L) as follows:

$$[CO2(aq)] = L^2/(K1^*(A+B)^2) \qquad \text{EQN. 7}$$

In some embodiments, EQN. 7 is used by the control module to determine the amount of CO2 to dissolve in H2O to obtain a desired conductivity.

The flow rate of carbon dioxide (FCO2) can be determined as follows:

$$FCO2 = FH2O^*[CO2(aq)] \qquad \text{EQN. 8}$$

where FH2O is the flow rate of the water (H2O).

In some embodiments, all of the CO2 is dissolved in the H2O. In such embodiments, a specific carbon dosage is determined as a function of temperature as follows:

$$[CO2(aq)] = L^2/f(T) \qquad \text{EQN. 9}$$

Typically, conductivity (L) is set by the user. In various embodiments, the flow rate of the carbon dioxide (FCO2) is used by the control module 125 for setting carbon dioxide mass flow controllers (CO2-MFC's). In some embodiments, the FCO2 is used by the control module 125 for setting valves and corresponding flow restrictors that the CO2 flows through. In other embodiments, the FCO2 is used by the control module 125 for setting valves and corresponding flow orifices that the CO2 flows through.

The dissociation constant (K1) and the specific conductivity (L) can be dependent on the temperature of the water (H2O). The factor shown above in EQN. 7, $(K1^*(A+B)^2)$, can be expressed as a function of the temperature of the water (H2O) as follows:

$$(K1^*(A+B)^2) = f(T) \qquad \text{EQN. 10}$$

In various embodiments, the temperature dependency of the factor, $(K1^*(A+B)^2)$, is determined as follows using DI water controlled at to two or more temperatures: for each temperature: 1) dissolve CO2 in DI water, 2) measure a conductivity (L) of the DI-CO2, 3) take a sample of the DI-CO2, 4) heat or cool the sample to room temperature, 5) measure the CO2(aq) concentration in the sample by titrating the sample with a solution of Sodium Hydroxide, and 6) for steps 3-5, isolate the sample from carbon dioxide in the air and isolate the air from carbon dioxide that escapes from the sample.

In other embodiments, the temperature dependency of the factor, $(K1*(A+B)^2)$, is determined as follows using DI water controlled at two or more temperatures: for each temperature: 1) dissolve CO2 in DI water, 2) measure conductivity (L) and temperature (T) of the resulting DI-CO2, 3) measure DI water flow rate and CO2 gas flow rate into the contactor, and 4) determine the CO2(aq) concentration by CO2 gas flow rate/ DI water flow rate. In some embodiments, the temperature dependence of $(K1*(A+B)^2)$ is stored in the control module and used for the determination of the CO2-flow into the contactor.

Figure 2:
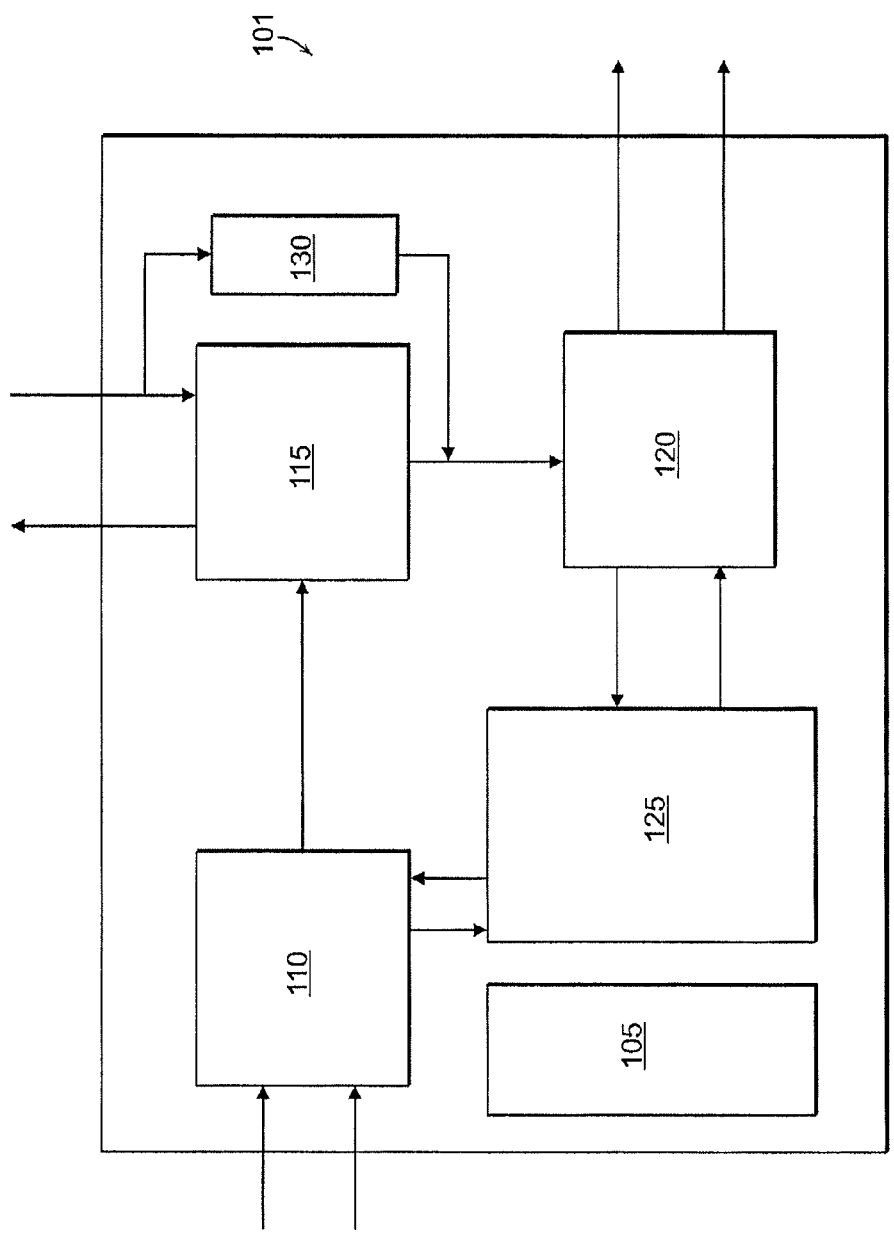
FIG. 2 is a block diagram of a second embodiment of the system for generating DI-$CO_2$ water.

FIG. 2 shows another embodiment of system 101. System 101 can include a by-pass unit 130 in addition to contactor 115. By-pass unit 130 can include a plurality of valves and sensors to monitor and/or control the parameters of DI water passing through the unit. The valves and sensors can be operated manually or controlled by the control module 125. One advantage of by-pass unit 130 is that it allows for a high volume of DI water to by-pass contactor 115 and mix with the DI-CO2 water being released from contactor 115. Another advantage of by-pass unit 130 is that it can shorten the response time required to go from high conductivity-low flow to low conductivity-high flow of the DI-CO2 water and vice versa.

Figure 3:
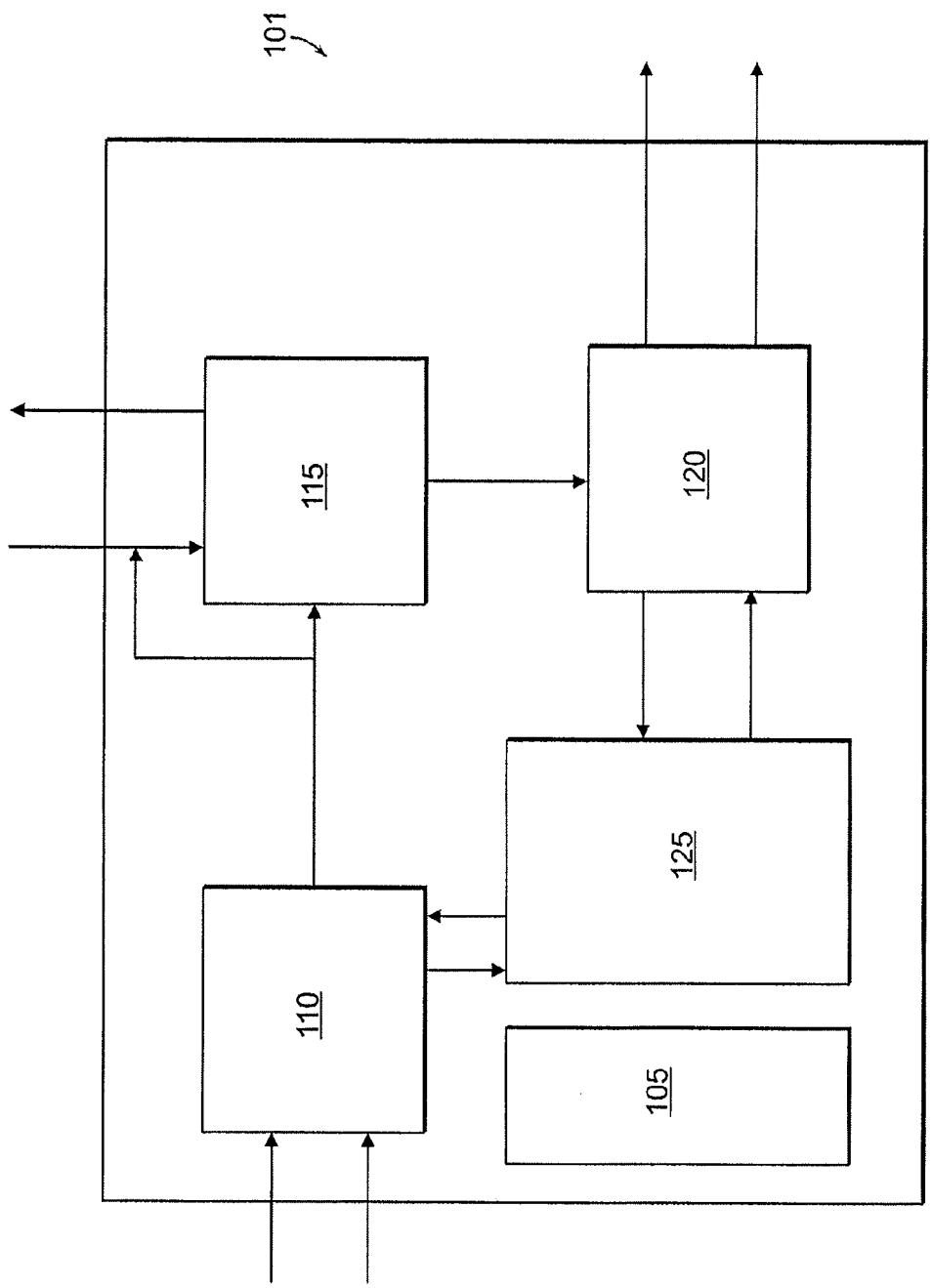
FIG. 3 is a block diagram of a third embodiment of the system for generating DI-$CO_2$ water.

FIG. 3 shows another embodiment of system 101. The gases exiting the gas module can directly enter the contactor 115 or can be mixed with the DI water prior to entering contactor 115. An advantage of this embodiment is that it can reduce the response time required to go from high conductivity-low flow to low conductivity-high flow of the DI-CO2 water and vice versa.

Figure 4:
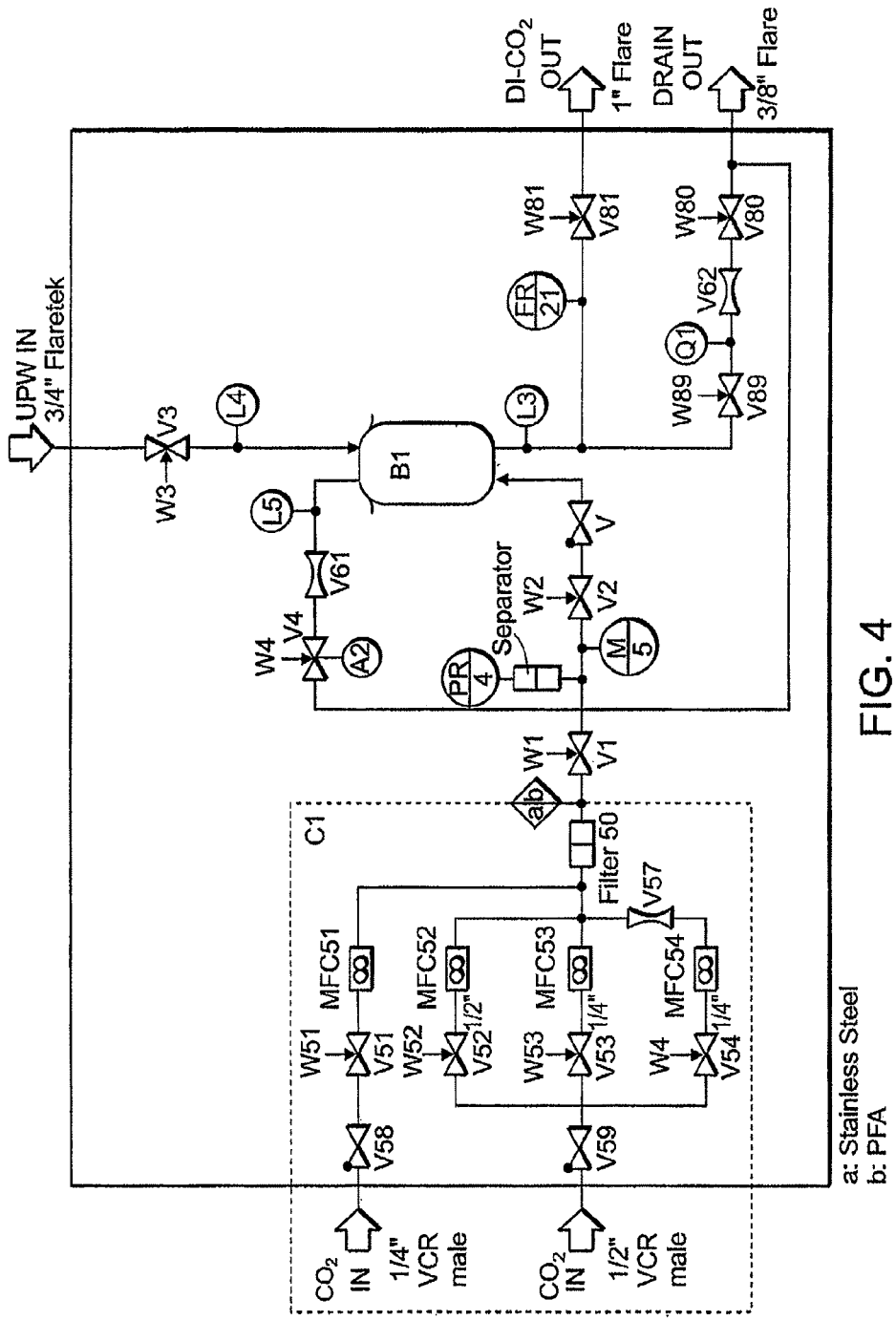
FIG. 4 is a detailed block diagram of an embodiment of the system for generating DI-$CO_2$ water.

FIG. 4 shows an exemplary embodiment of a device used to carbonate ultra-pure DI water (i.e., add CO2 to the DI water). The device includes a gas module C1 in fluid communication with a contactor B1. The gas module C1 includes two inlets for gases, variable valves V51-V54, V58, and V59, and four mass flow controllers MFC 51-MFC54. Gas module C1 also includes a feedback loop/mechanism where MFC52-MFC54 are mutually connected via V57. In some embodiments, variable valves V51-54, V58, and V59 are on/off valves.

A feedback loop/mechanism can allow for correction of the parameters of gases exiting gas module C1. For example, in the embodiment shown in FIG. 4, one or more of the MFCs may slightly degrade or deviate from their initial flow rate calibration. To correct these deviations, a feedback loop can be included within the gas module C1 so as to update control mechanisms of the MFCs overtime.

The MFCs can be either adjusted manually or automatically. The MFCs control the gas flow to such an extent that most if not all of the carbon dioxide entering B1 gets dissolved in the DI water and therefore the resulting DI-CO2 water is "bubble free." This prevents uneven concentrations that may lead to poor cleaning properties. While FIG. 4 illustrates a gas module with four MFCs, any number of MFC units can be utilized. In certain embodiments other flow controllers or concentration metering devices may be used in place of or in addition to the MFCs to control the gas flow in gas module C1.

As shown in FIG. 4, DI water can enter the contactor B1 via V3 and gases from gas module C1 can enter via V1 and V2. Light barriers or equivalent level sensors L3-L5 can be used to prevent gases from entering into the DI water line. In the contactor B1, carbon dioxide is mixed with the DI water until a desired amount of CO2 concentration is achieved. The DI-CO2 water is removed from B1 through an outlet DI-CO2 out via light barrier L3, sensor FR21 and valve V81. A sensor Q1 is connected in parallel to the DI-CO2 outlet. That is, a portion of the DI-CO2 water from the contactor can travel through a drain line that includes the sensor Q1 and valves V89, V62, V80. The sensor module includes sensors FR21 and Q1. Sensor FR21 monitors/controls the flow rate and sensor Q1 monitors/controls the temperature and conductivity of the DI-CO2 water. The sensor Q1, valves V89, V62, and V80 together with valves V4, V61 and level sensor L5 form a control loop which allows for purging/venting of the contactor B1. Q1 and FR21 can also be in communication with the mass flow controllers MFC51-MFC54 either directly or via a control module forming a feed-forward loop/mechanism.

The feed-forward mechanism allows the parameters of gases to be adjusted (for e.g., by changing the flow rate on one or more of the MFC) based upon the measurements taken at the sensor Q1 and the sensor FR21 and a desired CO2 set point. Sensor Q1 typically contains a metal electrode which can be kept in direct contact with the water flowing through it. The information gathered in the sensor module is relayed to the control module to adjust the amount of gases released from gas module C1. The control module can also allow for purging of the contactor B1. In certain embodiments, the control module further controls the feedback mechanism to adjust/correct deviations from initially calibrated values of the parameters set in gas module C1.

The feed-forward mechanism can control the CO2 concentration in the DI-CO2 water by monitoring parameters such as the temperature, flow rate and conductivity. For example, an operator of the device can use the control module to enter/ select in a computer/microprocessor, a desired CO2 set point for the outflow concentration of CO2 or conductivity of the DI water. Higher concentrations of CO2 in the DI water call for utilization of greater CO2 flow rates into the contactor B1 and result in a more acidic solution (e.g., pH of 4.5 or less); lower concentrations of CO2 in the DI water use a lower CO2 flow rate (less CO2 gas) and result in a less acidic solution (e.g., pH of 4.6 or greater). To control the output from the contactor B1, the system can utilize the feed-forward mechanism in which the temperature, flow rate and conductivity values of the outflow are measured and electronically sent to the control module for a determination of an input CO2 concentration (e.g., flow rate) from the gas module C1.

In addition to controlling the gas module C1, the feed-forward mechanism can also be involved in purging or venting the system. For example, during start up or when the CO2 set point is drastically changed resulting in a much lower input of CO2 from C1, a purge vent can be opened to vent excess gas (e.g., oxygen/air at start up and excess CO2 at a set point change). In some embodiments, the purge vent is opened to vent excess gas when a conductivity set point of the DI-CO2 water changes from a high set point (e.g., above about 10 µS/cm) to a low set point (e.g., below about 95% of the high set point). When the conductivity set point of the DI-CO2 water is very high (e.g., greater than 40 µS/cm) a portion of dissolved non-002 gas strips from the DI water inlet of the contactor into a gas phase of the contactor. To avoid stripping non-002 gas into the gas phase, in some embodiments, the purge vent is opened to vent excess CO2 gas when a conductivity set point of the DI-CO2 water is very high. Purging of the contactor B1 can be controlled automatically through the control system. In various embodiments the purge of the contactor B1 can be controlled manually by the operator opening a purge vent.

Figure 5:
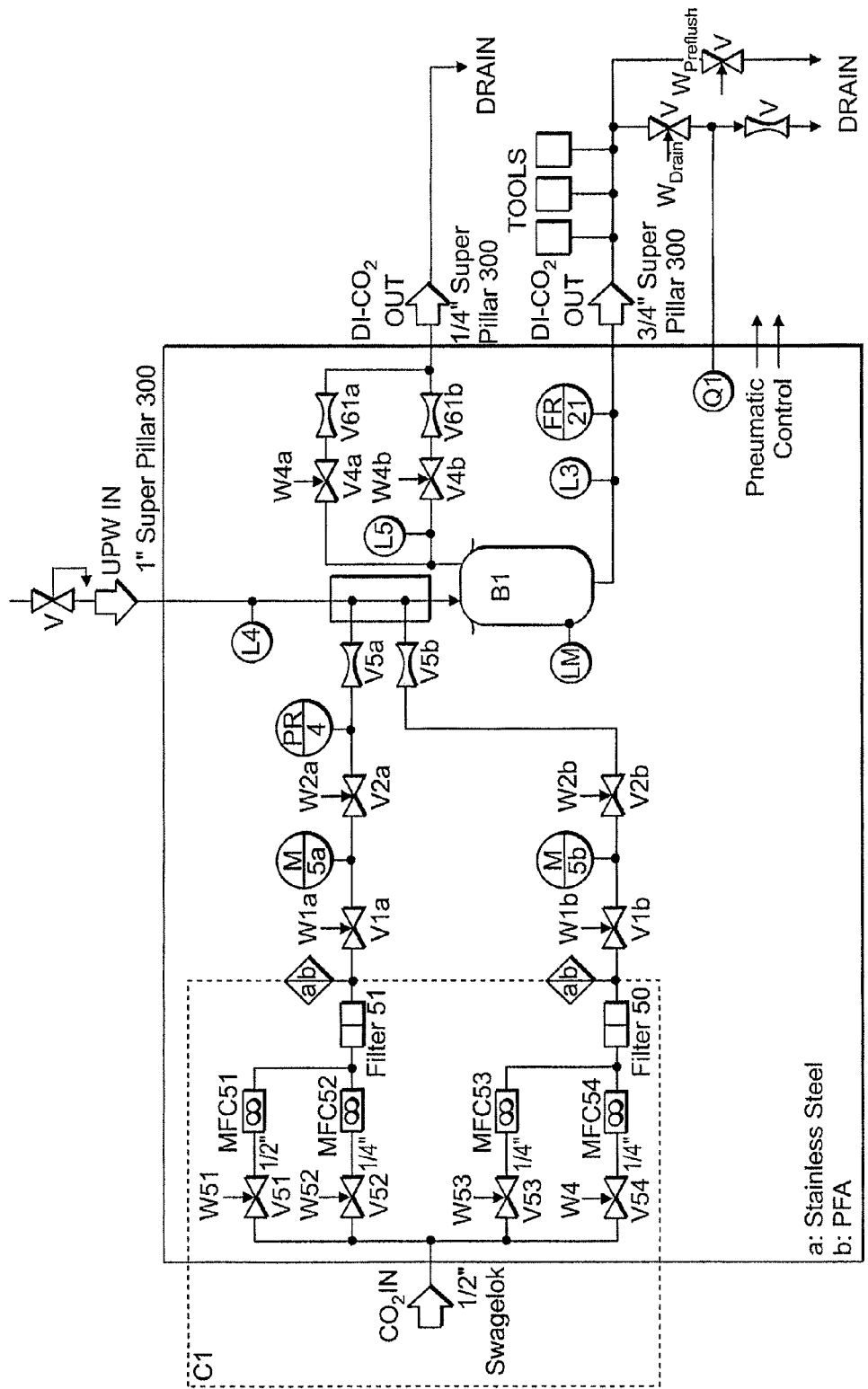
FIG. 5 is a detailed block diagram of another embodiment of the system for generating DI-$CO_2$ water.

FIG. 5 shows another exemplary embodiment of a device used to generate DI-CO2 water. In this embodiment, gas module C1 includes one gas inlet in fluid communication with 4 variable valves V51-V54, 4 MFCs MFC51-MFC54 and two gas filters 50 and 51. As shown in FIG. 5, two separate loops can be formed containing two MFCs each and resulting in two separate gas outlets. Each of the two separate outlets can deliver the gas to the DI water prior to entering the contactor. Each delivery path can include a plurality of valves such as V1a, V1b, V2a, V2b, V5a and V5b. Each delivery path can also include a plurality of sensors such as M5a, M5b, and PR4. The sensors can be used to monitor and/or control parameters such as flow rate or pressure of the gases passing through the system. In certain embodiments, one outlet can direct the gas into the DI-water before it enters the contactor and the other outlet can direct the gas into the contactor. An advantage of mixing the CO2 gas and DI water prior to entering the contactor is a shorter response time to change from one conductivity of the DI-CO2 water to another. Another advantage is the accuracy of the concentration of CO2 in the DI-CO2 water and the conductivity of the DI-CO2 water exiting the contactor. The two separate loops in the gas module C1 provide an additional feedback mechanism to allow more control of the parameters of the gas entering and exiting the gas module C1.

Figure 6:
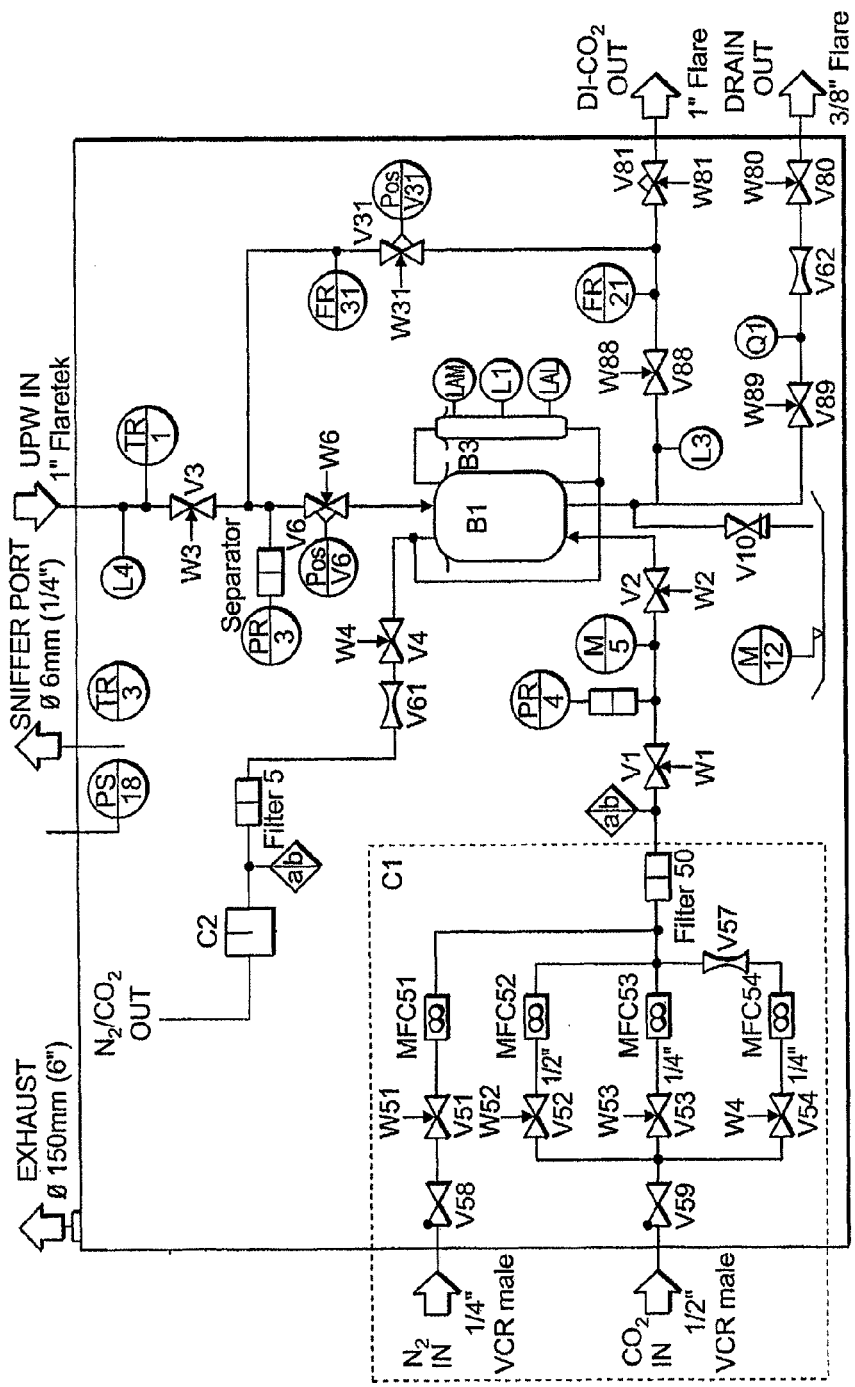
FIG. 6 is a detailed block diagram of yet another embodiment of the system for generating DI-$CO_2$ water.

FIG. 6 shows another exemplary embodiment of a device used to carbonate ultra-pure DI water (i.e., add CO2 to the DI water). In this embodiment, gas module C1 includes two gas inlets that can be used for two separate gases such as nitrogen and CO2. As shown in FIG. 6, variable valves V52-V54, and MFCs MFC52-MFC54 are mutually connected to form a loop. A separate gas can enter the system via variable valve V51 and MFC51. The two gases can be mixed in a desired proportion prior to exiting the gas module. Contactor B1 has an outlet that can release the gases via V4 and V61. The released gases can be recycled back into the gas module if desired or be released into the atmosphere.

Figure 11:
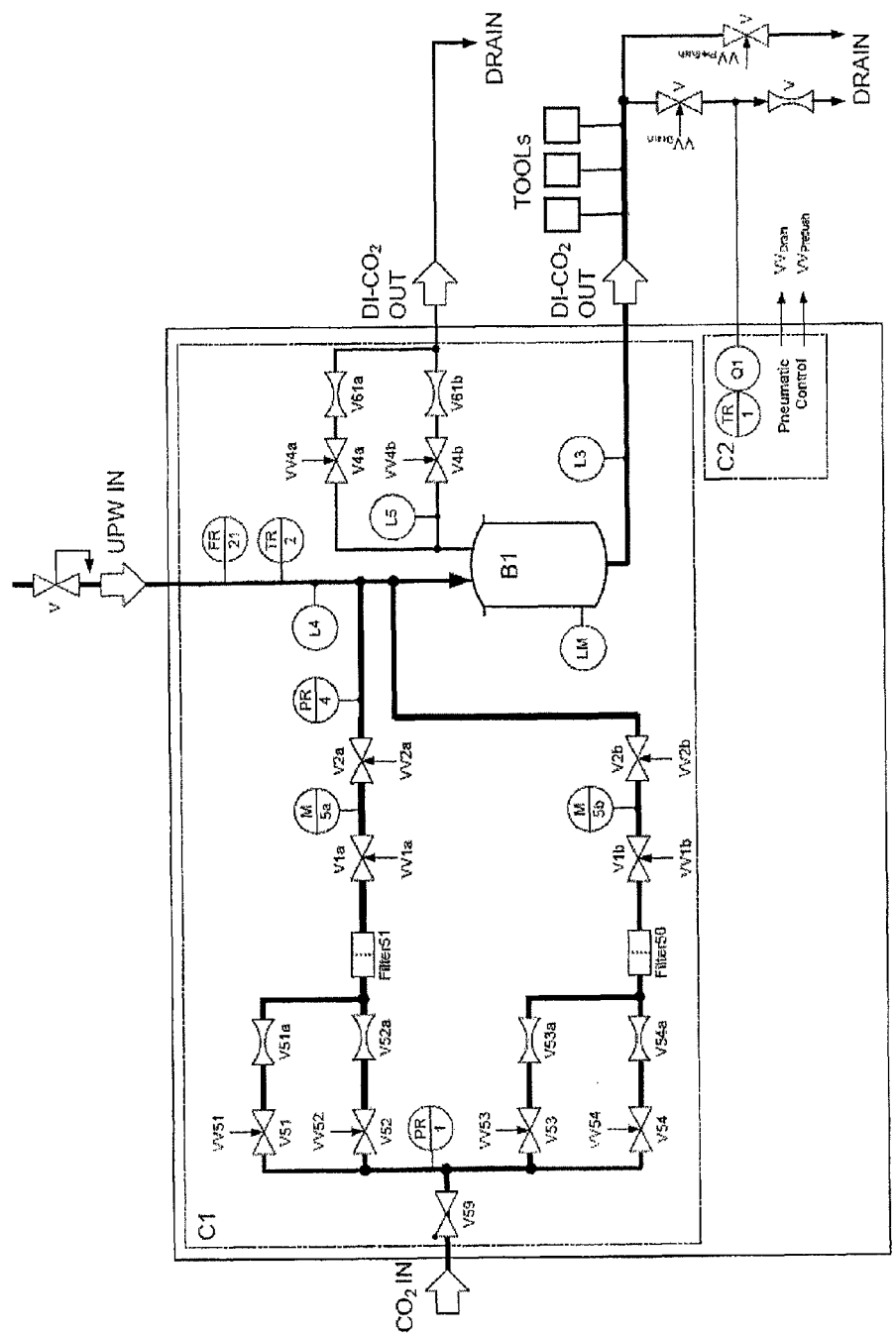
FIG. 11 is a detailed block diagram of an embodiment of the system for generating DI-$CO_2$ water.

FIG. 11 shows another exemplary embodiment of a device used to carbonate ultra-pure DI water (i.e., add CO2 to the DI water). In this embodiment, variable valves V1a, V1b, V2a, V2b, V51, V52, V53 and V54 and flow restrictors V51a, V52a, V53a, and V54a are used to control an amount of CO2 that is provided to an inlet of contactor B1. In some embodiments the amount of CO2 that is provided to the inlet is determined by the controller based on measured flow rate and temperature of the deionized water. In various embodiments, the amount of CO2 that is provided to the inlet is determined as described above in connection with EQN. 1 through EQN. 10.

As shown in FIG. 11, DI water can enter the contactor B1 via V10 and CO2 can enter the contactor B1 via V1a, V2a, V1b, and V2b. Level sensor L4 can be used to prevent gases from entering into the DI water line. In the contactor B1, CO2 is dissolved into the DI water until a desired amount of CO2 concentration is achieved. The DI-CO2 water is removed from B1 through an outlet, DI-CO2 out, and through the process tools via level sensor L3, sensors TR1 and Q1 and valves V20, V21 and V22. Sensors TR1 and Q1 monitor temperature and conductivity, respectively, at the DI-CO2 outlet of the contactor B1. In some embodiments, the measured temperature and conductivity at the DI-CO2 outlet are provided to a control module that adjusts the valves that the CO2 flows through, thus adjusting an amount of CO2 that flows into the contactor B1.

Sensors FR21 and Q1 can be placed at the DI water inlet of the contactor B1 and also be in communication with the flow restrictors V51a, V52a, V53a, and V54a either directly or indirectly via a control module, forming a feed-forward loop/mechanism. Sensor FR21 monitors the flow rate of the DI water and sensor Q1 monitors the temperature and conductivity of the DI water. In various embodiment, sensor FR21 is placed at the DI water inlet of the contactor B1 and sensor Q1 is placed at the DI-CO2 outlet of the contactor B1. In various embodiments, sensor FR21 is placed at the DI-CO2 outlet of the contactor B1 and sensor Q1 is placed at the DI water inlet of the contactor B1 are located at any position within the system.

The valves V4a and V4b, flow restrictors V61a V61b, and V80, together with level sensor L5 form a control loop which allows for purging and/or venting of the contactor B1 of a desired amount of CO2 gas. In some embodiment, the purged and/or vented CO2 gas exits the system via a drain.

In some embodiments, a control module turns the variable valves V1a, V1b, V2a, V2b, V51, V52, V53 and V54 on and off (e.g., pulse modulation) to achieve a desired average CO2 flow into the contactor B1 based on a pressure measured at the CO2 inlet of the contactor B1 by pressure sensor PR4. In some embodiments, the desired average CO2 flow is substantially equal to an amount of carbon dioxide determined by a controller (e.g., control module 125, as shown above in FIG. 1). In some embodiments, the variable valves are turned on and off with a frequency that is an input to the system. In some embodiments, the frequency is selected such that no fluctuation of the conductivity at the outlet occurs.

In some embodiments, the control module includes a pressure controller to set a desired pressure of the CO2 at the inlet of the contactor B1.

In some embodiments, the control module selects a subset of the variable valves V1a, V1b, V2a, V2b, V51, V52, V53 and V54 to turn on to achieve a desired CO2 flow into the contactor B1 based on a pressure measured at the inlet of the contactor B1 and a pressure drop across the flow restrictors (V51a, V52a, V53a, and V54a) that correspond to the valves.

In some embodiments, a combination of pulse modulation, pressure control and selecting a subset of valves for an on state is used to control the flow of CO2 that is present at the inlet of the contactor B1.

In some embodiments, the deionized water provided by the deionized water source and the carbon dioxide gas provided by the carbon dioxide source are mixed prior to entering the contactor.

Contactor B1 can have a by-pass unit B3 as shown in FIG. 6. By-pass unit B3 can include sensors LAH, L1 and LAL that can control and/or monitor parameters such as flow rate, pressure and liquid level. The sensors can be in communication with the control module to allow for automatic control or can be manually controlled. An advantage of the by-pass unit is when a high volume of the DI water is required. Another advantage of the by-pass unit is when a low concentration of CO2 in the DI water is desired. Yet another advantage of the by-pass unit is the speed with which the conductivity of the DI-CO2 water can be changed from low volume-high conductivity to high volume-low conductivity and vice versa.

Apart from the by-pass unit B3, a high volume of DI water can also be directed via a separate line passing through valve V31 and sensor FR31 as shown in FIG. 6. This DI water can be mixed with the DI-CO2 water exiting the contactor to alter the conductivity prior to exiting the system as desired.

A high volume of DI water in the range of about 20-80 L/min can be flowed through either the by-pass unit or the separate line or the combination of the two. In some embodiments, the range of the high volume of DI water can be about 32-50 L/min. In various embodiments, about 40-45 L/min of DI water can be flowed through the system.

The gas module is typically made of metals such as stainless steel. The valves, MFCs, and sensors are known to those skilled in the art and any commercially available valves, MFCs and sensors, regulators or monitors can be used. The gases and liquids typically pass through pipes or tubing made of corrosion resistant metals or metal alloys. Polymeric tubing or pipes made from PTFE, PVDF, PFA, PVC, PP, PE, ECTFE, C-PVC, etc. can also be used wherever possible.

Figure 7:
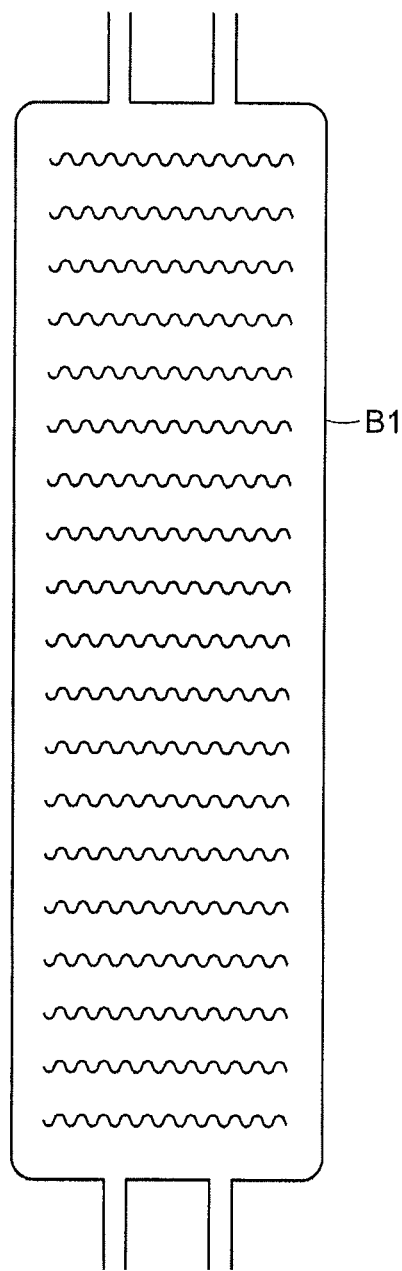
FIG. 7 is a cross-section of an embodiment of the contactor.

As shown in FIG. 7, the contactor is typically a vessel or a chamber that can withstand high pressure. It can be made either of glass or quartz or metal or metal alloys such as stainless steel, brass or polymers such as PTFE, PVDF, PFA, PVC, PP, PE, ECTFE, C-PVC, etc. In some embodiments, the contactor is made from a combination of one or more of the materials listed above.

A preferable contactor is shaped like a column and filled with "tower packing" with a high surface area per volume. Fibers made of the above mentioned polymers can be used for the tower packing. The high surface area enhances the rate of mixing of the carbon dioxide and DI water.

Figure 8:
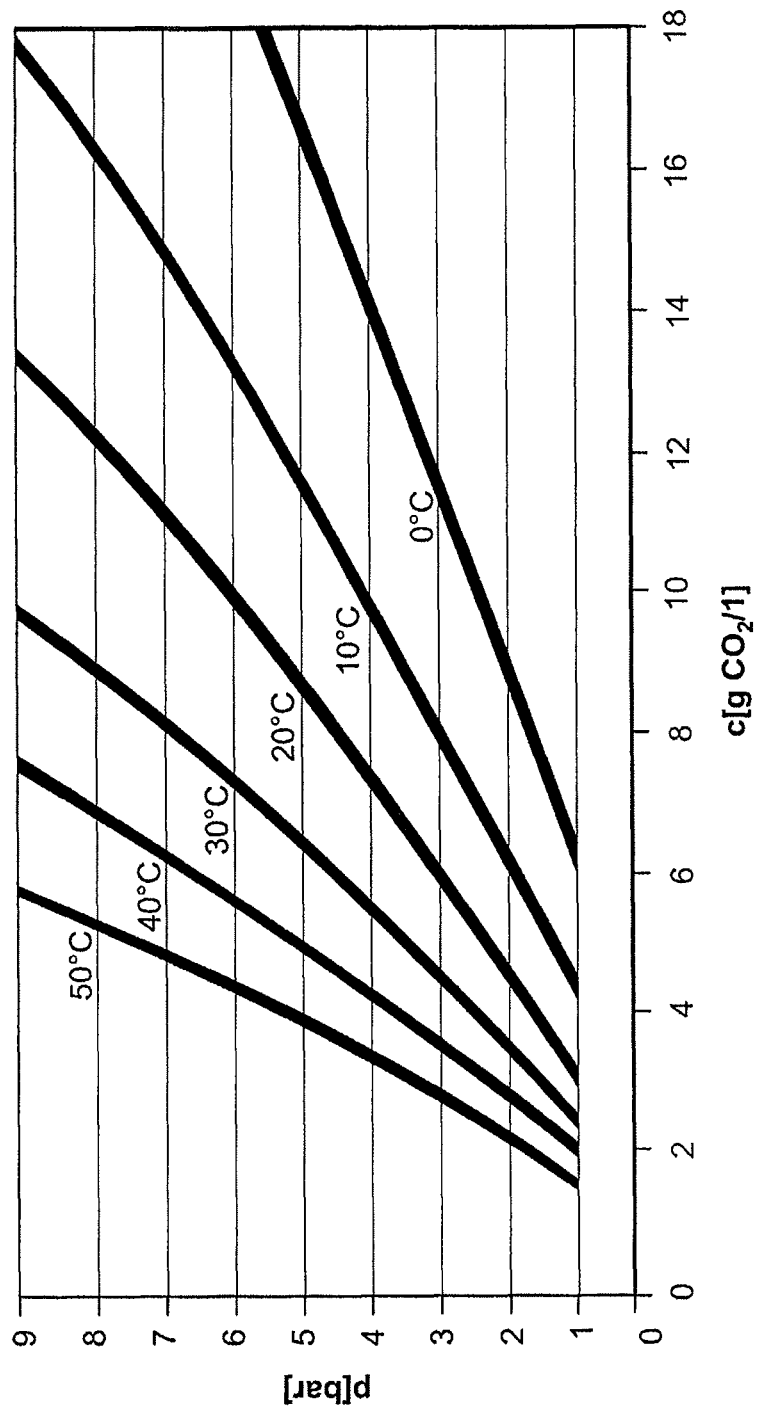
FIG. 8 is a graph showing the solubility of $CO_2$ gas in DI water at different values of temperature and pressure.
Figure 9:
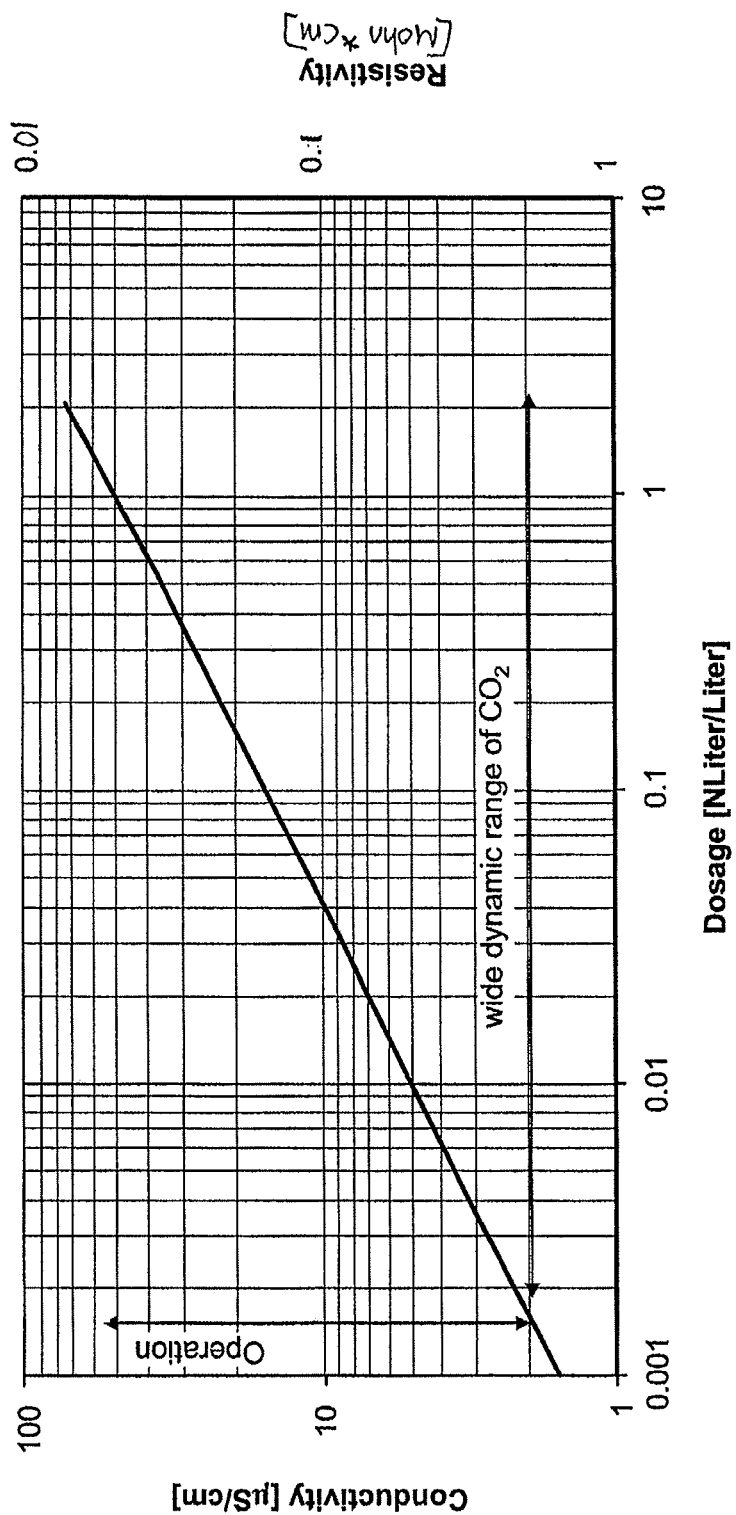
FIG. 9 is a graph of the dosage of $CO_2$ gas per liter of DI water versus the conductivity of the DI-$CO_2$ water.
Figure 10:
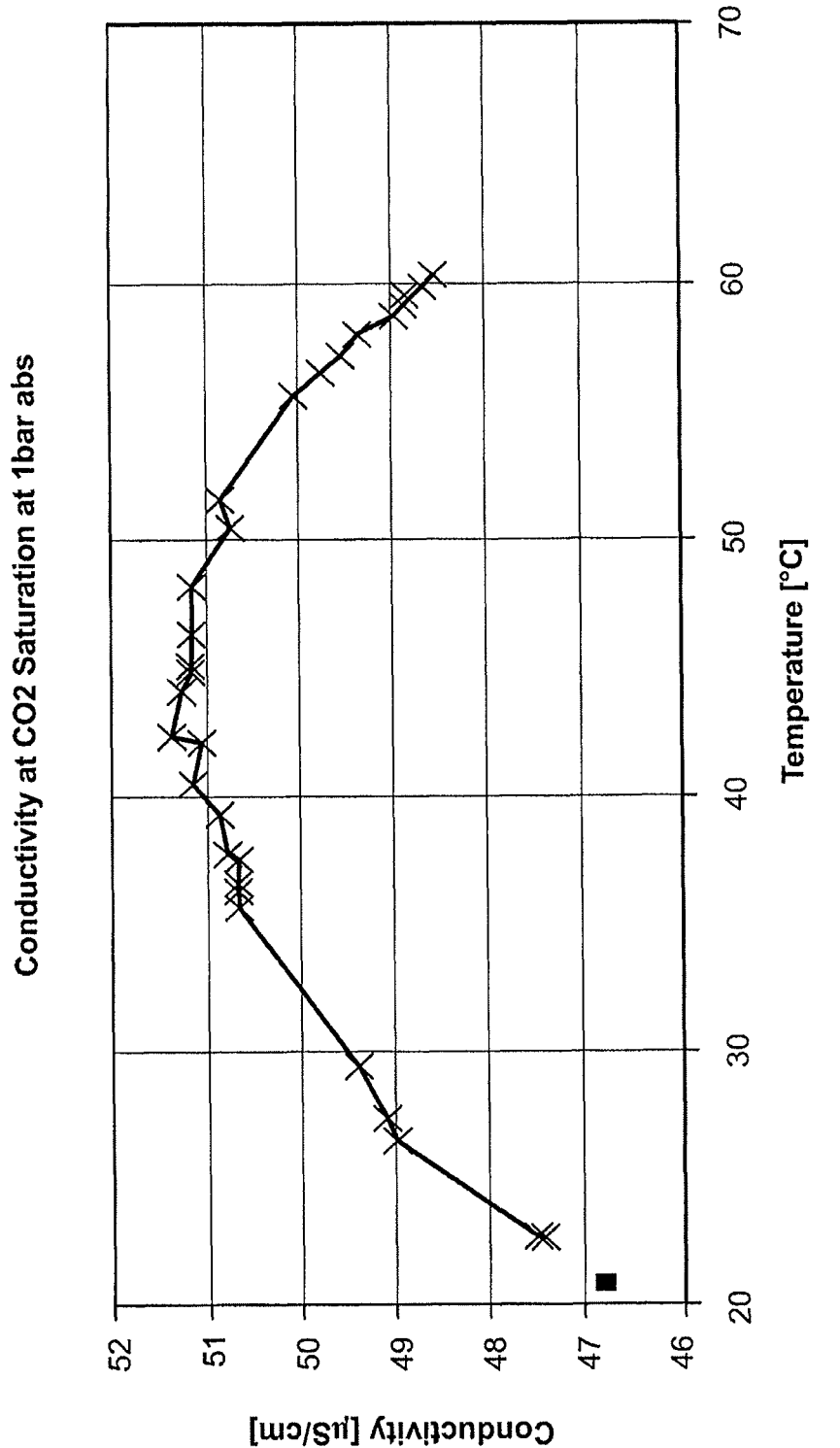
FIG. 10 is a graph of the conductivity of the DI-$CO_2$ water versus the temperature.

The control module 125 can include stored data relating the input CO2 flow rate from the gas module 110 to a specific temperature, DI-CO2 water flow output, and conductivity as shown in FIGS. 8-10. FIG. 8 shows the solubility of CO2 in DI water for different temperatures and pressures and FIG. 9 shows the specified conductivity range of 2-60 µS/cm lead to a very wide gas dosage range. FIG. 10 shows the correlation between the conductivity of carbonated water at different temperatures. In certain embodiments, the control module 125 can verify the desired input CO2 flow rate from the data stored therein and from the temperature, conductivity, flow rate, and set point values electronically sent or entered into the control module 125. In other embodiments, the control module 125 can calculate/extrapolate the input CO2 flow rate from the data stored therein in combination with the values electronically sent or entered. In certain embodiments, the control module sends an electronic signal to automatically adjust gas module 110. In various embodiments, the values calculated by the control module 125 can be used to manually adjust the parameters of gases and DI water entering and/or exiting the system 101.

In the embodiment shown in FIG. 4, conductivity measurements at Q1 are taken in a bypass line to a drain. In general, the measurements are taken in a bypass line to the drain due to metal contamination from the electrodes forming the conductivity sensor Q1. In other embodiments, it is possible to do a contamination free measurement in-line directly at the DI-CO2 outlet. This may be done with special electrodes or a contact free method.

In certain embodiments, an additional pressure regulator at the DI water inlet can lead to additional stability in concentration and thus increase the advantages for usage at a connected tool. A separation of the CO2 gas injection in two or more lines accordingly can be advantageous in certain DI-CO2 water generation methods. For example, a small amount of defined gas used to dilute the CO2 is preferable at low conductivity to avoid conductivity fluctuation caused by bubbles at the gas inlet. In various embodiments, DI water flow measurement can also be done at the water inlet.

Figure 12:
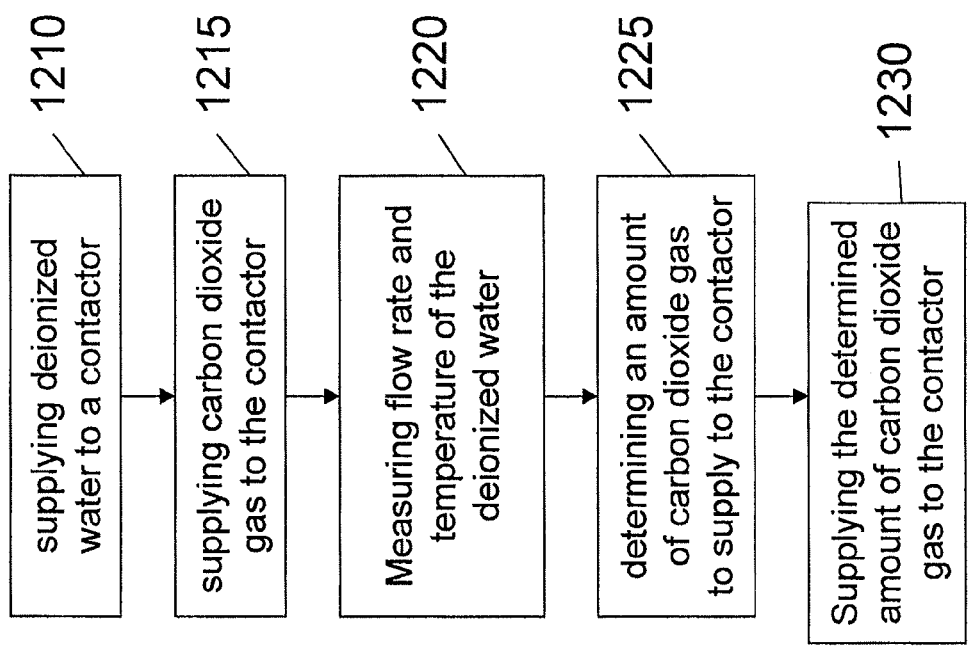
FIG. 12 is a flow diagram of an embodiment of a method for generating DI-$CO_2$ water.

In one embodiment, the gas control is achieved with mass-flow controllers. Due to a square relationship between the conductivity and concentration as shown in FIG. 9, a control element with such characteristics would be preferable. In another embodiment, a mechanism with switched flow restrictors and controlled pressure or a configuration with PWM (pulse wide modulation) controlled valves can be employed. For the range at very low conductivity, one option is to inject water which is already controlled enriched with CO2. FIG. 12 is a flow diagram of an embodiment of a method for generating DI-CO2 water. The method for generating DI-CO2 water includes supplying deionized water from a DI-CO2 source to a contactor (e.g., contactor 115, as described above in FIG. 1) (Step 1210). The method for generating DI-CO2 water also includes supplying CO2 from a CO2 source (e.g., gas module 110, shown above in FIG. 1) to the contactor (Step 1215). In various embodiments, the CO2 enters the contactor via a first inlet of the contactor, and the DI-CO2 enters the contactor via a second inlet of the contactor. In other embodiments, the CO2 and the DI-CO2 enter the contactor via one inlet of the contactor.

The method also includes measuring a flow rate and a temperature of the DI water (Step 1220). Next, the method includes determining an amount of CO2 to supply to the contactor such that a specific conductivity of DI-CO2 water is generator by the contactor (Step 1225). In some embodiments, the amount of CO2 to supply to the contactor is determined based on the measured flow rate and temperature of the DI water. In some embodiments, the amount of CO2 to supply to the contactor is determined according to EQNS. 1-10, as described above. In general, the amount of CO2 to supply to the contactor is determined based on a desired conductivity of the DI-CO2. In some embodiments, the desired conductivity is set by a user and the amount of CO2 to supply to the contractor is controlled by a controller (e.g., controller 125). In some embodiments, the amount of CO2 to supply to the contactor is based on a desired pressure of CO2 at an inlet of the contactor. In certain embodiments, the contactor is in communication with one or more sensors that measure the flow rate and temperature.

The method illustrated in FIG. 12 also includes supplying the determined amount of CO2 to the contactor via one or more valves (e.g., variable valves V1a, V1b, V2a, V2b, V51, V52, V53 and V54, as described above in FIG. 11) that are in communication with the supply of CO2 and the contactor (Step 1230). In some embodiments, the flow rate of the one or more valves is modified with one or more flow restrictors (e.g., flow restrictors V51a, V52a, V53a, and V54a, as described above in FIG. 11) and/or one or more flow orifices. In some embodiments, supplying the determined amount of CO2 involves varying one or more valves between an open and a closed position such that an average amount of CO2 flows from the CO2 source to the contactor. In some embodiments, the average amount of CO2 is substantially equal to the amount of CO2 determined above in Step 1225.

The DI-CO2 water generated by the present invention provides a damage free process for cleaning semiconductor devices in an electrically inert atmosphere. The dissolved CO2 reduces the resistivity of the DI water to a level that prevents surface charging. It also acidifies the DI water and increases the zeta potential. The DI-CO2 water allows to protect the integrity of fragile semiconductor devices. For example, the DI-CO2 water can be used to dissolve, oxidize, etch, and scrub contaminants from the surface of silicon wafers. The DI-CO2 water also prevents corrosion of metals during the wet-cleaning steps. The DI-CO2 water can also be used in commercially available wet cleaning devices or tools as a component or as a separate delivery system. Variations, modifications, and other implementations of what is described herein will occur to those of ordinary skill in the art without departing from the spirit and the scope of the invention. Accordingly, the invention is not to be limited only to the preceding illustrative descriptions.

What is claimed is:

1. A system for carbonation of deionized water comprising:
a deionized water source;
a carbon dioxide gas source;
a contactor in fluid communication with the deionized water source and the carbon dioxide gas source via at least one inlet of the contactor, the contactor generating carbonated deionized water;
at least one sensor in fluid communication with the at least one inlet or at least one outlet of the contactor for measuring flow rate of the deionized water and temperature of the deionized water; and
a controller in communication with the at least one sensor and the carbon dioxide gas source for determining an amount of carbon dioxide gas the carbon dioxide gas source supplies to the contactor such that a specific conductivity of the carbonated deionized water is generated in the contactor, wherein the determination is based on the measured flow rate and temperature.

2. The system of claim 1 further comprising one or more valves that are in fluid communication with the carbon dioxide gas source and the contactor for controlling the amount and flow rate of carbon dioxide gas entering the contactor.

3. The system of claim 2 wherein the controller varies the one or more valves between an open and a closed position such that an average amount of carbon dioxide gas that flows from the carbon dioxide gas source to the contactor is substantially equal to the determined amount of carbon dioxide gas supplied by the carbon dioxide gas source.

4. The system of claim 3 further comprising one or more flow restrictors in fluid communication with the carbon dioxide gas source and the one or more valves.

5. The system of claim 3 further comprising one or more flow orifices in fluid communication with the carbon dioxide gas source and the one or more valves.

6. The system of claim 3 further comprising one or more flow restrictors in fluid communication with the one or more valves and the contactor.

7. The system of claim 3 further comprising one or more flow orifices in fluid communication with the one or more valves and the contactor.

8. The system of claim 2 further comprising at least four flow restrictors.

9. The system of claim 1 further comprising an outlet of the contactor for purging an amount of carbon dioxide gas.

10. The system of claim 9 wherein the controller determines the amount of carbon dioxide gas to purge such that a specific conductivity of the carbonated deionized water is generated in the contactor.

11. The system of claim 10 further comprising at least one flow restrictor in fluid communication with the outlet of the contactor and a drain for controlling the amount and flow rate of carbon dioxide gas purged from the contactor.

12. The system of claim 10 further comprising at least one flow orifice in fluid communication with the outlet of the contactor and a drain for controlling the amount and flow rate of carbon dioxide gas purged from the contactor.

13. The system of claim 1 wherein the controller sets a pressure of carbon dioxide gas at the at least one inlet.

14. The system of claim 1 wherein deionized water provided by the deionized water source and carbon dioxide provided by the carbon dioxide source are mixed prior to entering the contactor.

15. The system of claim 1 further comprising a by-pass unit in fluid communication with the deionized water source and the outlet of the carbonated deionized water.

16. The system of claim 1 further comprising:
a first sensor in fluid communication with at least one inlet of the contactor for measuring flow rate of the deionized water; and
a second sensor in fluid communication with at least one outlet of the contactor for measuring temperature of the deionized water.

17. The system of claim 1 further comprising:
a first sensor in fluid communication with at least one inlet of the contactor for measuring temperature of the deionized water; and
a second sensor in fluid communication with at least one outlet of the contactor for measuring flow rate of the deionized water.

* * * * *

UNITED STATES PATENT AND TRADEMARK OFFICE
CERTIFICATE OF CORRECTION

PATENT NO. : 8,727,323 B2
APPLICATION NO. : 13/871626
DATED : May 20, 2014
INVENTOR(S) : Johannes Seiwert et al.

Page 1 of 1

It is certified that error appears in the above-identified patent and that said Letters Patent is hereby corrected as shown below:

Title Page, item (12), delete "Seiwart et al." and insert --Seiwert--.

Title Page, item (72), under Inventors, please correct name from "Johannes Seiwart" to --Johannes Seiwert--.

Signed and Sealed this
Ninth Day of September, 2014

Michelle K. Lee
*Deputy Director of the United States Patent and Trademark Office*